United States Patent
Ou

(10) Patent No.: US 9,456,471 B2
(45) Date of Patent: Sep. 27, 2016

(54) HEAT TREATMENT APPARATUS

(71) Applicant: SHENZHEN CHINA STAR OPTOELECTRONICS TECHNOLOGY CO., LTD., Shenzhen, Guangdong (CN)

(72) Inventor: Weifeng Ou, Guangdong (CN)

( * ) Notice: Subject to any disclaimer, the term of this patent is extended or adjusted under 35 U.S.C. 154(b) by 0 days.

(21) Appl. No.: 14/111,797

(22) PCT Filed: Jun. 30, 2013

(86) PCT No.: PCT/CN2013/078541
§ 371 (c)(1),
(2) Date: Oct. 15, 2013

(87) PCT Pub. No.: WO2014/190588
PCT Pub. Date: Dec. 4, 2014

(65) Prior Publication Data
US 2016/0088683 A1    Mar. 24, 2016

(30) Foreign Application Priority Data
May 31, 2013    (CN) .......................... 2013 1 0212971

(51) Int. Cl.
| | |
|---|---|
| *A21B 1/00* | (2006.01) |
| *H05B 3/68* | (2006.01) |
| *H05B 1/00* | (2006.01) |
| *G03F 7/38* | (2006.01) |
| *H01L 21/67* | (2006.01) |
| *G03F 7/16* | (2006.01) |

(52) U.S. Cl.
CPC .................. *H05B 1/00* (2013.01); *G03F 7/168* (2013.01); *G03F 7/38* (2013.01); *H01L 21/67109* (2013.01)

(58) Field of Classification Search
CPC .................. H01L 21/67109; H01L 21/67138; H01L 21/67207–21/67236; H01L 21/67155; H01L 21/67161–21/67201; G03F 7/16–7/168
USPC .......... 219/395–399, 443.1–468.2; 118/724, 118/725
See application file for complete search history.

(56) References Cited

U.S. PATENT DOCUMENTS

| | | | | |
|---|---|---|---|---|
| 5,802,856 A | * | 9/1998 | Schaper ..................... | B01L 7/52 118/724 |
| 5,846,375 A | * | 12/1998 | Gilchrist ........... | H01J 37/32724 118/723 E |
| 6,072,163 A | * | 6/2000 | Armstrong ........ | H01L 21/67103 118/724 |
| 2006/0011611 A1 | * | 1/2006 | Goto ....................... | H05B 3/143 219/444.1 |

* cited by examiner

*Primary Examiner* — Sang Y Paik

(57) ABSTRACT

A heat treatment apparatus includes a hot plate, at least two heat sources, and a switching mechanism. The hot plate serves as the heating medium between the at least two heat sources and the substrate to be processed, the switching mechanism is configured in such a way that the hot plate contacts one or two of the at least two heat sources selectively, the processing temperature of the hot plate can be changed quickly from one temperature to another temperature.

15 Claims, 3 Drawing Sheets

HEAT TREATMENT APPARATUS

FIELD OF THE INVENTION

The present invention relates to a heat treatment apparatus, which can be used for LCD (liquid crystal display) modules and semiconductor chips in particular.

BACKGROUND OF THE INVENTION

The statements in this section merely provide background information related to the present invention and may or may not constitute prior art.

It is known that heat treatment apparatuses (also referred as prebaking machine) are used to prebake the resist coated on a substrate in the photolithography process for manufacturing a semiconductor device such as LCD modules and semiconductor chips. The heat treatment apparatus can prebake the resist coated on the substrate preliminary so as to evaporate the solvent for the resist and enhance the adhesion of the resist. The heat treatment apparatus used in prebaking unit usually comprises a heat source, and a hot plate or a cold plate. The hot plate serves to heat the substrate to 50~130° C., the cold plate serves to cool the substrate to ambient temperature. The heat source transfer heat to the hot plate or the cold plate, so as to heat or cool the substrate mounted on the hot plate or the cold plate. In tradition, there is only a heat source; and the heat treatment temperature can not varied from one temperature to another temperature.

SUMMARY OF THE INVENTION

The present invention provides a heat treatment apparatus to solve the mentioned problem above.

The present invention is realized in such a way that: a heat treatment apparatus, comprising a hot plate, at least two heat sources, and a switching means, wherein the hot plate serves as the heating medium between the at least two heat sources and the substrate to be processed, the switching means is configured in such a way that the hot plate contacts one or two of the at least two heat sources selectively.

According to another embodiment disclosed herein, the substrate is a glass substrate for a LCD module.

According to another embodiment disclosed herein, the hot plate comprises a cavity for receiving thermally conductive medium.

According to another embodiment disclosed herein, the heat treatment apparatus further comprises a pushing means for pushing the hot plate upwards.

According to another embodiment disclosed herein, the heat treatment apparatus comprises a first heat source, a second heat source and a third heat source, the first heat source is arranged between the second heat source and the third heat source in left-right direction.

According to another embodiment disclosed herein, the first heat source has a first processing temperature, the second heat source has a second processing temperature, the third heat source has a third processing temperature, the second processing temperature is higher than the first processing temperature, the first processing temperature is higher than the third processing temperature.

According to another embodiment disclosed herein, the switching means comprises a first linear cylinder, a second linear cylinder and a third linear cylinder, the second linear cylinder is arranged between the first linear cylinder and the third linear cylinder in left-right direction, the cylinder body of the first linear cylinder is fixed, the free end of the piston rod of the first linear cylinder is connected with the second heat source, the cylinder body of the second linear cylinder is connected with the second heat source, the free end of the piston rod of the second linear cylinder is connected with the first heat source, the cylinder body of the third linear cylinder is connected with the first heat source, the free end of the piston rod of the third linear cylinder is connected with the third heat source.

According to another embodiment disclosed herein, the switching means further comprises a sliding rail, the first heat source, the second heat source and the third heat source are provided with a sliding groove engaging with the sliding rail.

According to another embodiment disclosed herein, the hot plate contacts one or two of the at least two heat sources in a surface-to-surface manner.

According to another embodiment disclosed herein, the hot plate is provided with a plurality of V-shaped grooves, and the at least two heat sources are provided with a plurality of inverted V-shaped protrusions correspondingly.

According to another embodiment disclosed herein, the hot plate is a hot plate with vapor chamber.

According to another embodiment disclosed herein, the hot plate contacts one or two of the at least two heat sources in a surface-to-surface manner.

According to another embodiment disclosed herein, the hot plate is provided with a plurality of V-shaped grooves, and the at least two heat sources are provided with a plurality of inverted V-shaped protrusions correspondingly.

According to yet another embodiment disclosed herein, the hot plate is a hot plate with vapor chamber.

According to the present invention, the heat treatment apparatus comprises a hot plate, at least two heat sources, and a switching means, wherein the hot plate serves as the heating medium between the at least two heat sources and the substrate to be processed, the switching means is configured in such a way that the hot plate contacts one or two of the at least two heat sources selectively, the processing temperature of the hot plate can be changed quickly from one temperature to another temperature.

For more clearly and easily understanding above content of the present invention, the following text will take a preferred embodiment of the present invention with reference to the accompanying drawings for detail description as follows.

BRIEF DESCRIPTION OF THE DRAWINGS

The drawings described herein are for illustration purposes only and are not intended to limit the scope of the present disclosure in any way.

DETAILED DESCRIPTION OF PREFERRED EMBODIMENTS

The following detailed description of every embodiment with reference to the accompanying drawings is used to exemplify a specific embodiment, which may be carried out in the present invention. Directional terms mentioned in the present invention, such as "top", "bottom", "front", "rear", "leftwards", "rightwards", "upwards", "down", "inside", "outside", "side" etc., are only used with reference to the orientation of the accompanying drawings. Therefore, the used directional terms are intended to illustrate, but not to limit, the present invention. Also the following description is merely exemplary in nature and is not intended to limit the present disclosure, application, or uses. Besides, the term "hot plate" used herein means a thermally conductive plate used to heat (hot plate) or cool the substrate (cold plate); the term "heat source" used herein means a device for supplying heat such as a electric heater or a device for decreasing temperature such as a cooler.

The heat treatment apparatus according to the present invention comprises at least two heat sources, the switching means can drive the hot plate or one to more heat sources to move such that the hot plate contacts one or two of the at least two heat sources selectively. In this way, the processing temperature of the hot plate can be changed quickly.

Figure 1:
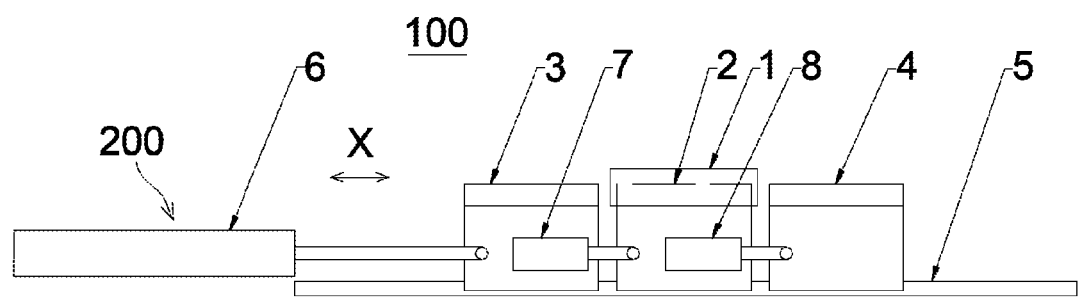
FIG. 1 is a schematic view of the heat treatment apparatus according to an embodiment of the present invention, wherein the hot plate is on the first heat source.

As shown in FIG. 1, the heat treatment apparatus 100 in this embodiment comprises a hot plate 1 and three heat sources, i.e. a first heat source 2, a second heat source 3 and a third heat source 4. The hot plate 1 serves as the heating medium (thermally conductive medium) between the heat sources and the substrate to be processed. The switching means 200 is configured to drive one heat sources to move such that the hot plate 1 contacts one or two of the three heat sources selectively. The processing temperatures output to the hot plate 1 by the three heat sources are different to each other. The processing temperatures of the three heat sources can be set as desired.

In this embodiment, the substrate is a glass substrate for a LCD module. To be specific, the heat treatment apparatus may be used to prebake the photo resist coating film.

As shown in FIG. 1 through FIG. 5, in the heat treatment apparatus 100, the first heat source 2, the second heat source 3 and the third heat source 4 are arranged in line, the first heat source 2 is arranged between the second heat source 3 and the third heat source 4 in left-right direction X. The first heat source 2 has a first processing temperature T1, the second heat source 3 has a second processing temperature T2, the third heat source 4 has a third processing temperature T3. Moreover, the second processing temperature T2 is higher than the first processing temperature T1, the first processing temperature T1 is higher than the third processing temperature T3, i.e. T2>T1>T3.

Furthermore, the switching means 200 comprises a first linear cylinder 6, a second linear cylinder 7 and a third linear cylinder 8. As known, a linear cylinder comprises a cylinder body and a piston rod driven by the cylinder body. The second linear cylinder 7, the first linear cylinder 6 and the third linear cylinder 8 are arranged in line. The second linear cylinder 7 is arranged between the first linear cylinder 6 and the third linear cylinder 8 in left-right direction X. The cylinder body of the first linear cylinder 6 is fixed (stationary), the free end of the piston rod of the first linear cylinder 6 is connected with the second heat source 3. The cylinder body of the second linear cylinder 7 is connected with the second heat source 3, and the free end of the piston rod of the second linear cylinder 7 is connected with the first heat source 2. The cylinder body of the third linear cylinder 8 is connected with the first heat source 2, and the free end of the piston rod of the third linear cylinder 8 is connected with the third heat source 4.

Figure 6:
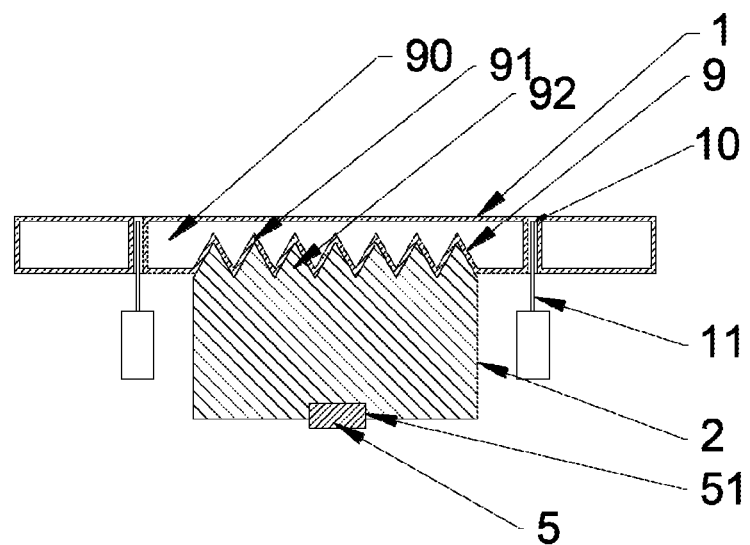
FIG. 6 is a sectional view of the heat treatment apparatus in FIG. 1.

As shown in FIG. 6, the switching means 200 further comprises a sliding rail 5. Accordingly, the first heat source 2, the second heat source 3 and the third heat source 4 are provided with a sliding groove 51 engaging with the sliding rail 5. In this way, the first heat source 2, the second heat source 3 and the third heat source 4 can slide smoothly along the rail 5 under the action of the linear cylinders (switching means).

Figure 2:
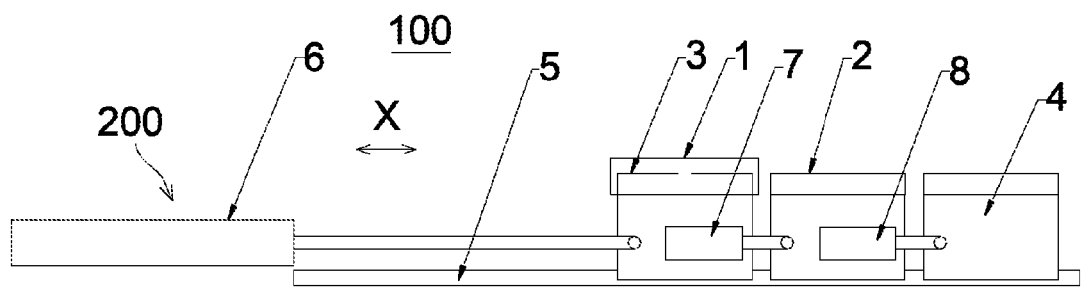
FIG. 2 is another schematic view of the heat treatment apparatus in FIG. 1, wherein the hot plate is on the second heat source.
Figure 3:
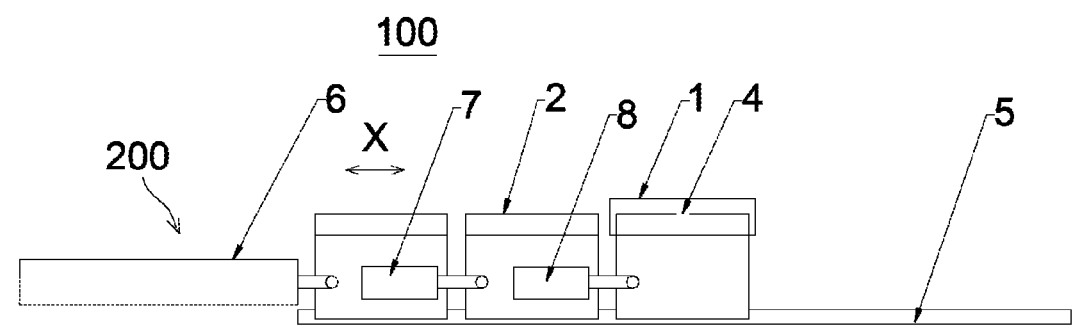
FIG. 3 is another schematic view of the heat treatment apparatus in FIG. 1, wherein the hot plate is on the third heat source.

Under the driving action of the first linear cylinder 6, the second linear cylinder 7 and the third linear cylinder 8, one of the first heat source 2, the second heat source 3 and the third heat source 4 moves to contact with the hot plate 1. The hot plate 1 contacts with the first heat source 2, as shown in FIG. 1. When the free end of the piston rod of the first linear cylinder 6 moves rightwards, the first heat source 2, the second heat source 3 and the third heat source 4 move rightwards along the left-right direction X as a whole, such that the hot plate 1 contacts with the second heat source 3, as shown in FIG. 2. When the free end of the piston rod of the first linear cylinder 6 moves leftwards, the first heat source 2, the second heat source 3 and the third heat source 4 move leftwards along the left-right direction X as a whole, such that the hot plate 1 contacts with the third heat source 4, as shown in FIG. 3.

Although in this embodiment the switching means drives the heat sources to move, the switching means can drive the hot plate to move in other embodiment. Although in this embodiment the switching means uses linear cylinders, the switching means can uses robots in other embodiment.

To improve the thermally conducting efficiency, the hot plate 1 contacts one or two of the first heat source 2, the second heat source 3, and the third heat source 4 in a surface-to-surface manner. In this embodiment, the hot plate 1 is provided with a plurality of V-shaped grooves 91 along the left-right direction, and the first heat source 2, the second heat source 3, the third heat source 4 are provided with a plurality of inverted V-shaped protrusions 92 correspondingly, as shown in FIG. 6.

As shown in FIG. 6, the hot plate 1 comprises a cavity 90 for receiving thermally conductive medium (working fluid). And the hot plate 1 is a hot plate with vapor chamber (also be referred as Vapor chamber). The Vapor chamber is named by the main character of component. It belongs to flat style heat pipe based on the theory that it utilizes the potential heat produced by working fluid when it happens phase transition, it is also named as uniform heat board or steam slice.

As shown in FIG. 6, the heat treatment apparatus further comprises a pushing means 11 for pushing the hot plate 1 upwards. The pushing means 11 may be a linear cylinder. When the hot plate 1 is lifted up by the pushing means 11, the substrate can be handled by a robot.

Now the working examples of the heat treatment apparatus will be described.

The first heat source 2 has a first processing temperature T1, the second heat source 3 has a second processing temperature T2, the third heat source 4 has a third processing temperature T3. The second processing temperature T2 is higher than the first processing temperature T1, the first processing temperature T1 is higher than the third processing temperature T3, i.e. T2>T1>T3. In FIG. 1, the hot plate 1 contacts with the first heat source 2 and thus also the processing temperature of the hot plate 1 will be equal with the first processing temperature T1. If the target processing temperature of the hot plate 1 is the second processing temperature T2, then the first heat source 2, the second heat source 3 and the third heat source 4 will be driven to move rightwards along the left-right direction X as a whole by the first linear cylinder 6, such that the second heat source 3 moves to contact with the hot plate 1 as shown in FIG. 2. Likewise, if the target processing temperature of the hot plate 1 is the third processing temperature T3, then the first heat source 2, the second heat source 3 and the third heat source 4 will be driven to move leftwards along the left-right direction X as a whole by the first linear cylinder 6, such that the third heat source 4 moves to contact with the hot plate 1 as shown in FIG. 3.

Figure 4:
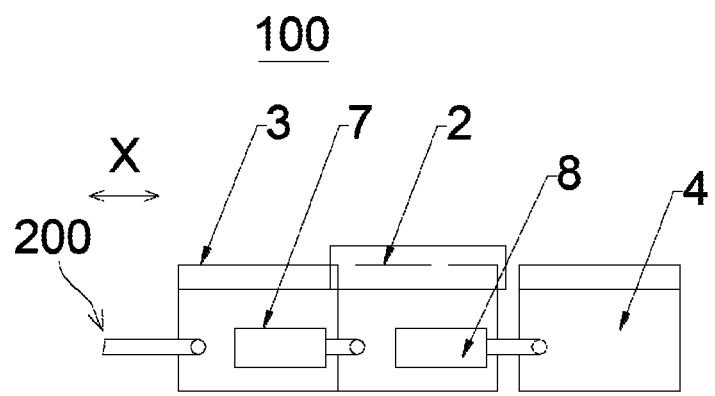
FIG. 4 is another schematic view of the heat treatment apparatus in FIG. 1, wherein the hot plate is on the first heat source and the third heat source.
Figure 7:
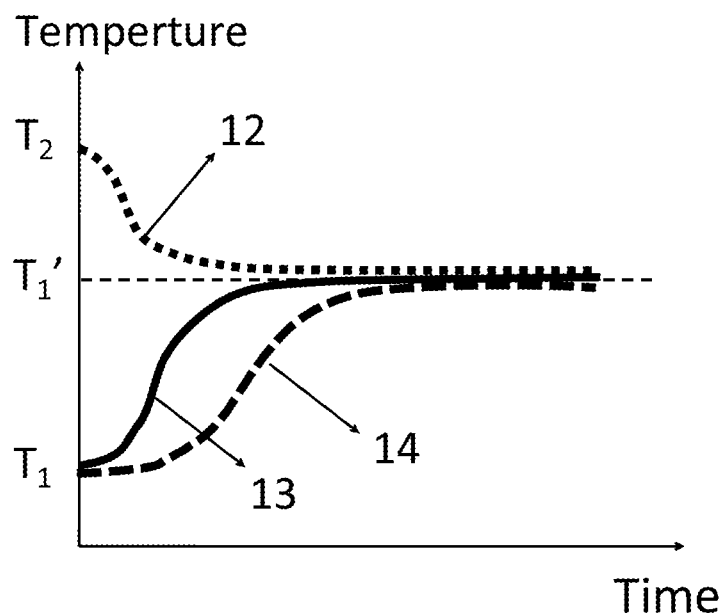
FIG. 7 is a temperature-time curve of the substrate processed by the heat treatment apparatus in FIG. 4.

If the target processing temperature T1' of the hot plate 1 is between the first processing temperature T1 and the second processing temperature T2, then the first heat source 2 and the third heat source 4 will be driven to move towards the second heat source 3 under the action of the second linear cylinder 7, such that the first heat source 2 contacts the second heat source 3 as shown in FIG. 4. In this way, the first heat source 2 and the second heat source 3 transfer heat to the hot plate 1 at the same time. As shown in FIG. 7, the temperature of the second heat source 3 drops to the target processing temperature T1' as curve 12, the temperature of the first heat source 2 increases to the target processing temperature T1' as curve 13. Curve 14 is the rising curve of the temperature of the first heat source 2 when the first heat source 2 is not driven to contact the second heat source 3. It is easy to know that it is time-consuming for curve 14 compared with curve 13. In other words, the heat treatment apparatus according to the present invention can save time and change the processing temperature of the hot plate quickly from one temperature to another temperature.

Figure 5:
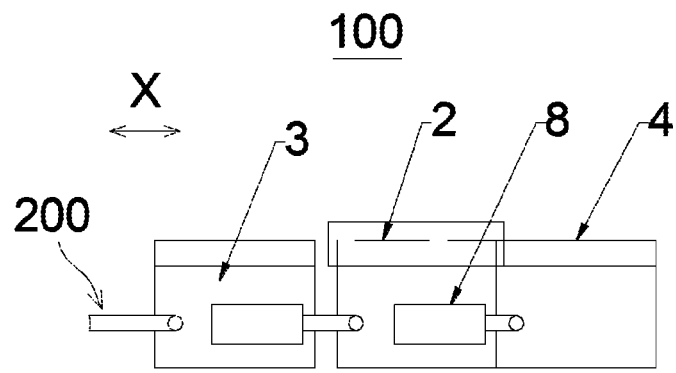
FIG. 5 is another schematic view of the heat treatment apparatus in FIG. 1, wherein the hot plate is on the first heat source and the second heat source.
Figure 8:
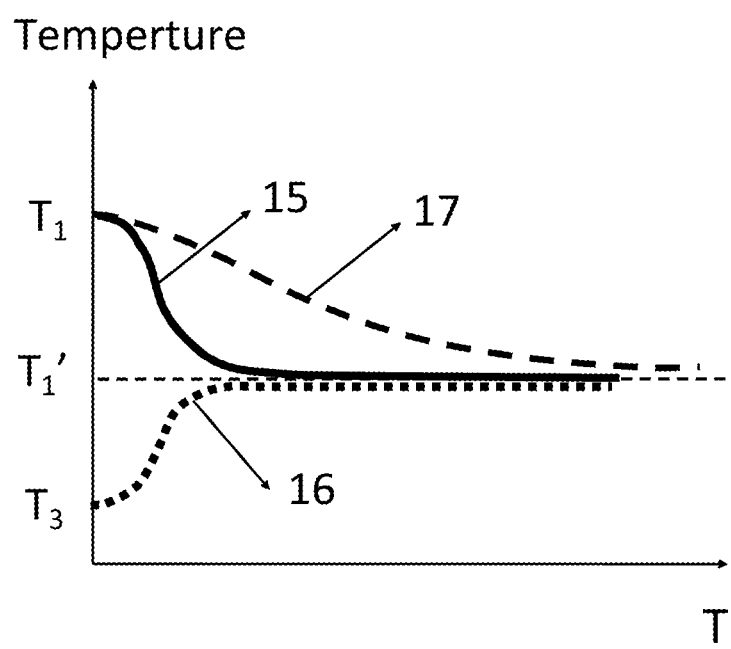
FIG. 8 is a temperature-time curve of the substrate processed by the heat treatment apparatus in FIG. 5.

If the target processing temperature T1' of the hot plate 1 is between the first processing temperature T1 and the third processing temperature T3, then the third heat source 4 will be driven to move towards the first heat source 2 under the action of the third linear cylinder 8, such that the third heat source 4 contacts the first heat source 2 as shown in FIG. 5. In this way, the first heat source 2 and the third heat source 4 transfer heat to the hot plate 1 at the same time. As shown in FIG. 8, the temperature of the third heat source 4 increases to the target processing temperature T1' as curve 16, the temperature of the first heat source 2 drops to the target processing temperature T1' as curve 15. Curve 17 is the decreasing curve of the temperature of the first heat source 2 when the third heat source 4 is not driven to contact the first heat source 2. It is easy to know that it is time-consuming for curve 17 compared with curve 15. In other words, the heat treatment apparatus according to the present invention can save time and change the processing temperature of the hot plate quickly from one temperature to another temperature.

Compared with the prior art, the heat treatment apparatus according to the present invention have two or more processing temperature for heating or cooling the substrate. Furthermore, the heat treatment apparatus according to the present invention can save time and change the processing temperature of the hot plate quickly from one temperature to another temperature.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the 3 particular embodiment disclosed, but that the present invention will include all embodiments falling within the scope of the appended claims.

What is claimed is:

1. A heat treatment apparatus, comprising a hot plate, at least two heat sources, and a switching mechanism, wherein the hot plate serves as the heating medium between the at least two heat sources and the substrate to be processed, the switching mechanism is configured in such a way that the hot plate contacts one or two of the at least two heat sources selectively; and the hot plate is separated from the at least two sources and capable of moving relative to the two heat sources.

2. The heat treatment apparatus of claim 1, wherein the substrate is a glass substrate for a LCD module.

3. The heat treatment apparatus of claim 1, wherein the hot plate comprises a cavity for receiving thermally conductive medium.

4. The heat treatment apparatus of claim 1, wherein the heat treatment apparatus further comprises a pushing mechanism for pushing the hot plate upwards.

5. The heat treatment apparatus of claim 1, wherein the at least two heat sources comprises a first heat source, a second heat source and a third heat source, the first heat source is arranged between the second heat source and the third heat source in left-right direction.

6. The heat treatment apparatus of claim 5, wherein the first heat source has a first processing temperature, the second heat source has a second processing temperature, the third heat source has a third processing temperature, the second processing temperature is higher than the first processing temperature, the first processing temperature is higher than the third processing temperature.

7. The heat treatment apparatus of claim 6, wherein the switching mechanism comprises a first linear cylinder, a second linear cylinder and a third linear cylinder, the second linear cylinder is arranged between the first linear cylinder and the third linear cylinder in left-right direction, the cylinder body of the first linear cylinder is fixed, the free end of the piston rod of the first linear cylinder is connected with the second heat source, the cylinder body of the second linear cylinder is connected with the second heat source, the free end of the piston rod of the second linear cylinder is connected with the first heat source, the cylinder body of the third linear cylinder is connected with the first heat source, the free end of the piston rod of the third linear cylinder is connected with the third heat source.

8. The heat treatment apparatus of claim 7, wherein the switching mechanism further comprises a sliding rail, the first heat source, the second heat source and the third heat source are provided with a sliding groove engaging with the sliding rail.

9. The heat treatment apparatus of claim 1, wherein the hot plate contacts one or two of the at least two heat sources in a surface-to-surface manner.

10. The heat treatment apparatus of claim 9, wherein the hot plate is provided with a plurality of V-shaped grooves, and the at least two heat sources are provided with a plurality of inverted V-shaped protrusions correspondingly.

11. The heat treatment apparatus of claim 9, wherein the hot plate is a hot plate with vapor chamber.

12. The heat treatment apparatus of claim 7, wherein the hot plate contacts one or two of the at least two heat sources in a surface-to-surface manner.

13. The heat treatment apparatus of claim 12, wherein the hot plate is provided with a plurality of V-shaped grooves, and the at least two heat sources are provided with a plurality of inverted V-shaped protrusions correspondingly.

14. The heat treatment apparatus of claim 12, wherein the hot plate is a hot plate with vapor chamber.

15. A heat treatment apparatus, comprising a hot plate, a first heat source, a second heat source, a third heat source, and a switching means mechanism, wherein the hot plate serves as the heating medium between the first, second, and third heat sources and the substrate to be processed, the switching mechanism is configured in such a way that the hot plate contacts one or two of the first, second, and third heat sources selectively; and wherein the switching mechanism comprises a first linear cylinder, a second linear cylinder and a third linear cylinder, the second linear cylinder is arranged between the first linear cylinder and the third linear cylinder in left-right direction, the cylinder body of the first linear cylinder is fixed, the free end of the piston rod of the first linear cylinder is connected with the second heat source, the cylinder body of the second linear cylinder is connected with the second heat source, the free end of the piston rod of the second linear cylinder is connected with the first heat source, the cylinder body of the third linear cylinder is connected with the first heat source, the free end of the piston rod of the third linear cylinder is connected with the third heat source.

* * * * *